United States Patent
Daubenspeck et al.

(10) Patent No.: US 9,397,054 B2
(45) Date of Patent: Jul. 19, 2016

(54) SEMICONDUCTOR STRUCTURE WITH AN INTERCONNECT LEVEL HAVING A CONDUCTIVE PAD AND METALLIC STRUCTURE SUCH AS A BASE OF A CRACKSTOP

(71) Applicant: GLOBALFOUNDRIES INC., Grand Cayman (KY)

(72) Inventors: Timothy H. Daubenspeck, Colchester, VT (US); Jeffrey P. Gambino, Westford, VT (US); Christopher D. Muzzy, Burlington, VT (US); Wolfgang Sauter, Richmond, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/876,889

(22) Filed: Oct. 7, 2015

(65) Prior Publication Data
US 2016/0027744 A1    Jan. 28, 2016

Related U.S. Application Data

(62) Division of application No. 14/059,486, filed on Oct. 22, 2013, now Pat. No. 9,190,318.

(51) Int. Cl.
*H01L 23/48* (2006.01)
*H01L 23/00* (2006.01)
(Continued)

(52) U.S. Cl.
CPC ........ *H01L 23/562* (2013.01); *H01L 21/76802* (2013.01); *H01L 21/76843* (2013.01); *H01L 21/76871* (2013.01); *H01L 21/76877* (2013.01); *H01L 23/3192* (2013.01); *H01L 23/481* (2013.01); *H01L 23/522* (2013.01); *H01L 23/585* (2013.01); *H01L 24/05* (2013.01);
(Continued)

(58) Field of Classification Search
CPC ................... H01L 2924/00014; H01L 23/481; H01L 2924/00; H01L 24/11; H01L 2924/01029
USPC .................................................. 257/751, 762
See application file for complete search history.

(56) References Cited

U.S. PATENT DOCUMENTS

| 4,922,326 A | 5/1990 | Blumenshine et al. |
| 4,976,814 A | 12/1990 | Blumenshine et al. |

(Continued)

OTHER PUBLICATIONS

U.S. Appl. No. 14/059,486, Office Action Communication Dated Apr. 28, 2015, pp. 1-7.

(Continued)

*Primary Examiner* — Andy Huynh
(74) *Attorney, Agent, or Firm* — Gibb & Riley, LLC; Anthony J. Canale

(57) ABSTRACT

A semiconductor structure with an interconnect level above a substrate and including a conductive pad and a metallic structure, such as a base of a crackstop. A first dielectric layer is above the conductive pad and above the metallic structure. A first opening in the first dielectric layer is aligned with and exposes the conductive pad and a second opening is aligned with and exposes the metallic structure. A metallic liner lines the first opening and the second opening and is on the top surface of the first dielectric layer. A second dielectric layer is above the metallic liner and a third dielectric layer is above the second dielectric layer. A third opening exposes a portion of the metal liner above the conductive pad and a copper plug and pedestal are in the third opening on the exposed portion of the metal liner.

18 Claims, 13 Drawing Sheets

(51) Int. Cl.
H01L 21/768 (2006.01)
H01L 23/31 (2006.01)
H01L 23/58 (2006.01)
H01L 23/522 (2006.01)

(52) U.S. Cl.
CPC ............... H01L24/11 (2013.01); H01L 24/13 (2013.01); *H01L 23/3114* (2013.01); *H01L 24/03* (2013.01); *H01L 2224/02126* (2013.01); *H01L 2224/0345* (2013.01); *H01L 2224/0346* (2013.01); *H01L 2224/0347* (2013.01); *H01L 2224/0348* (2013.01); *H01L 2224/03462* (2013.01); *H01L 2224/0401* (2013.01); *H01L 2224/0508* (2013.01); *H01L 2224/05009* (2013.01); *H01L 2224/05022* (2013.01); *H01L 2224/05027* (2013.01); *H01L 2224/0558* (2013.01); *H01L 2224/05124* (2013.01); *H01L 2224/05147* (2013.01); *H01L 2224/05155* (2013.01); *H01L 2224/05166* (2013.01); *H01L 2224/05171* (2013.01); *H01L 2224/05181* (2013.01); *H01L 2224/05184* (2013.01); *H01L 2224/05186* (2013.01); *H01L 2224/05568* (2013.01); *H01L 2224/1134* (2013.01); *H01L 2224/1147* (2013.01); *H01L 2224/11849* (2013.01); *H01L 2224/13009* (2013.01); *H01L 2224/13023* (2013.01); *H01L 2224/13082* (2013.01); *H01L 2224/13111* (2013.01); *H01L 2224/13139* (2013.01); *H01L 2224/13147* (2013.01); *H01L 2224/94* (2013.01); *H01L 2924/014* (2013.01); *H01L 2924/01029* (2013.01); *H01L 2924/0132* (2013.01); *H01L 2924/01073* (2013.01); *H01L 2924/04941* (2013.01); *H01L 2924/04953* (2013.01); *H01L 2924/12042* (2013.01); *H01L 2924/15788* (2013.01)

(56) References Cited

U.S. PATENT DOCUMENTS

| | | | |
|---|---|---|---|
| 5,024,970 | A | 6/1991 | Mori |
| 7,207,096 | B2 | 4/2007 | Gambino et al. |
| 7,323,780 | B2 | 1/2008 | Daubenspeck et al. |
| 7,573,115 | B2 | 8/2009 | Melville et al. |
| 7,687,915 | B2 | 3/2010 | Lee et al. |
| 7,704,804 | B2 | 4/2010 | Daubenspeck et al. |
| 7,777,339 | B2 | 8/2010 | Daubenspeck et al. |
| 7,821,104 | B2 | 10/2010 | Lee et al. |
| 7,875,502 | B2 | 1/2011 | Brofman et al. |
| 7,985,671 | B2 | 7/2011 | Daubenspeck et al. |
| 8,299,581 | B2 | 10/2012 | Daubenspeck et al. |
| 8,450,849 | B2 | 5/2013 | Lu et al. |
| 2009/0149013 | A1 | 6/2009 | Daubenspeck et al. |
| 2012/0126228 | A1 | 5/2012 | Fischer et al. |
| 2015/0031189 | A1 | 1/2015 | Chen et al. |

OTHER PUBLICATIONS

U.S. Appl. No. 14/059,486, Office Action Communication Dated May 21, 2015, pp. 1-9.
U.S. Appl. No. 14/059,486, Notice of Allowance Communication Dated Aug. 11, 2015, pp. 1-8.

SEMICONDUCTOR STRUCTURE WITH AN INTERCONNECT LEVEL HAVING A CONDUCTIVE PAD AND METALLIC STRUCTURE SUCH AS A BASE OF A CRACKSTOP

CROSS-REFERENCE TO RELATED APPLICATIONS

This application is a divisional of U.S. patent application Ser. No. 14/059,486, filed Oct. 22, 2013, now issued as U.S. Pat. No. 9,190,318 on Nov. 17, 2015, the complete disclosure of which is incorporated herein by reference.

BACKGROUND

The present invention relates to a semiconductor structure, and particularly, to an integrated crackstop structure.

In the manufacture of semiconductor devices, a plurality of integrated circuits are simultaneously prepared in a semiconductor wafer through the use of conventional photolithographic techniques. Thus, for example, a wafer may contain multiple separate integrated circuits which have been formed on the substantially planar surface area of the wafer according to conventional techniques. It is also convenient to provide a plurality of secondary devices such as contact pads, test monitor devices, and devices for measurement and alignment on the planar surface adjacent the outer perimeter of each integrated circuit or other semiconductor device. Each single integrated circuit is of relatively minute dimensions so that it is convenient to simultaneously form a plurality of them in a single wafer while marking the boundaries between the individual devices along perpendicular axes referred to as dicing lines or a kerf region. Since the dicing area is a region cut by a metal rotary blade, an element of an IC (hereinafter referred to as a function element) is not formed in this region, but a test element for testing the function element or an alignment mark for mask alignment is often formed there.

In accordance with techniques well known in the art, after a semiconductor wafer has been formed into interconnected semiconductor devices, the chips are tested to identify those which are satisfactory and those improperly formed or malfunctioning and unsatisfactory. As mentioned earlier, it is common practice to put test, measurement, alignment and die seal structures in the kerf region. After testing, adjacent satisfactory chips are left joined together while unsatisfactory chips are separated or the entire wafer is separated and the unsatisfactory chips are discarded. Separation (or dicing) may be performed by conventional techniques such as sawing or laser cutting along the dicing line.

One of the greatest problems of large scale integration is that of obtaining a high enough yield of devices from each wafer to be commercially profitable. As the number and complexity of devices per wafer increases, the yield often decreases proportionally. It is therefore highly desirable to minimize the number of devices that must be discarded as unsatisfactory.

One concern affecting yield is chip package interaction (CPI). A mismatch in the coefficient of thermal expansion between a chip and a laminate may lead to increased stress applied to the chip and result in mechanical damage to the chip. More specifically, the weaker high performance dielectric layers, for example lowK and UltralowK, are susceptible to such mechanical damage. This mechanical damage is detectable using Sonoscan imagery, and appears as a classic "white bump", with the damage closely affiliated with the solder connection through which the breaking stress is transferred.

White-bump mitigating structural modifications are a subject of considerable interest in today's chip manufacturing environment. Chip package interaction structural modifications may include thicker layers of polymer final passivation material (for example PSPI), which may function as a stress buffer. However, polymer passivation materials tend to have high internal stress, causing wafer bow when applied in thick blanket films. Customized discontinuous structures, such as PSPI Islands or annular bump pads, must be used to reap the benefits of a thick PSPI layer while at the same time limiting wafer bow.

Independently of these concerns, with newer technology nodes, there is a move towards elimination of the industry-standard aluminum pad for cost reduction. The aluminum pad is typically replaced with a copper "plug" which fills the final via structure. Copper Plug formation processes are generally incompatible with the thick-PSPI CPI structures described above. Simultaneous with all of these concerns is the requirement to create a chip-edge crackstop structure that will prevent microcracks from propagating through the dielectric layers of the chip.

More specifically, the dicing operation used to cut a semiconductor wafer into individual chips often induces microcracks in both the semiconductor substrate and the dielectric layers on top. Microcracks occurring in silicon substrates propagate very rapidly and tend to lead to failures that show up in the initial testing described above. Microcracks in dielectric layers propagate more slowly and tend to lead to delayed failures—often after the device is put in service in the field. Failures in the field are particularly expensive and disruptive.

SUMMARY

According to an embodiment of the invention, a method is provided. The method may include forming a first dielectric layer above a conductive pad and above a metallic structure, the conductive pad and the metallic structure are each located within an interconnect level above a substrate, forming a first opening and a second opening in the first dielectric layer, the first opening is aligned with and exposes the conductive pad and the second opening is aligned with and exposes the metallic structure, and forming a metallic liner on the conductive pad, on the metallic structure, and above the first dielectric layer. The method may further include forming a second dielectric layer above the metallic liner, and forming a third dielectric layer above the second dielectric layer, the third dielectric layer is thicker than either the first dielectric layer or the second dielectric layer.

According to another embodiment of the invention, a method is provided. The method may include forming a first dielectric layer above a conductive pad and above a metallic structure, the conductive pad and the metallic structure are each located within an interconnect level above a substrate, forming a first opening and a second opening in the first dielectric layer, the first opening is aligned with and exposes the conductive pad and the second opening is aligned with and exposes the metallic structure, and forming a metallic liner on the conductive pad, on the metallic structure, and above the first dielectric layer. The method may further include forming a second dielectric layer above the metallic liner, forming a third dielectric layer above the second dielectric layer, the third dielectric layer is thicker than either the first dielectric layer or the second dielectric layer, and patterning the third dielectric layer to create a third opening and a fourth opening, the third opening is aligned with and above the conductive pad and the fourth opening is located between the conductive pad and the metallic structure, the third dielectric layer remains above the metallic structure. The method may further include removing a portion of the second dielectric layer exposed in the third opening and the fourth opening to expose the metallic liner, forming a copper plug and a copper pedestal on a first portion of the metallic liner above the conductive pad, the copper plug is formed within the first opening in the third dielectric layer and the copper pedestal is formed on top of the copper plug, and removing a second portion of the metallic liner in the fourth opening to expose the first dielectric layer.

According to another embodiment of the invention, a structure is provided. The structure may include a metallic structure positioned within an interconnect level above a substrate, the metallic structure is adjacent to a kerf of the substrate, a first dielectric layer above the interconnect level, the first dielectric layer comprising an opening aligned with and above the metallic structure, and a metallic liner above the first dielectric layer, within the opening, and on the metallic feature. The structure may further include a second dielectric layer above the metallic liner, and a third dielectric layer above the second dielectric layer, the third dielectric layer is thicker than either the first dielectric layer or the second dielectric layer.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art. In the description, details of well-known features and techniques may be omitted to avoid unnecessarily obscuring the presented embodiments.

The present invention relates to a semiconductor structure, and particularly, to an integrated crackstop structure. Integrating the fabrication of a crackstop structure into a bonding pad structure process flow may reduce failures and improve yield. One way to fabricate the crackstop structure alongside a bonding pad structure in the same process flow is described in detail below by referring to the accompanying drawings FIG. 1-8.

FIG. 1-8 illustrate and describe stages in a fabrication process of a structure 100 in accordance with an embodiment of the invention. Each of the figures is a cross section of a portion of a semiconductor wafer. The structure 100, as illustrated, may be divided into three regions, an interconnect region, a crackstop region, and a kerf region. As illustrated in the figures, the crackstop region may generally be located near or adjacent to the kerf region. The border between the crackstop region and the kerf region is identified by a vertical dashed line for reference purposes only, and is intended to improve understanding.

Figure 1:
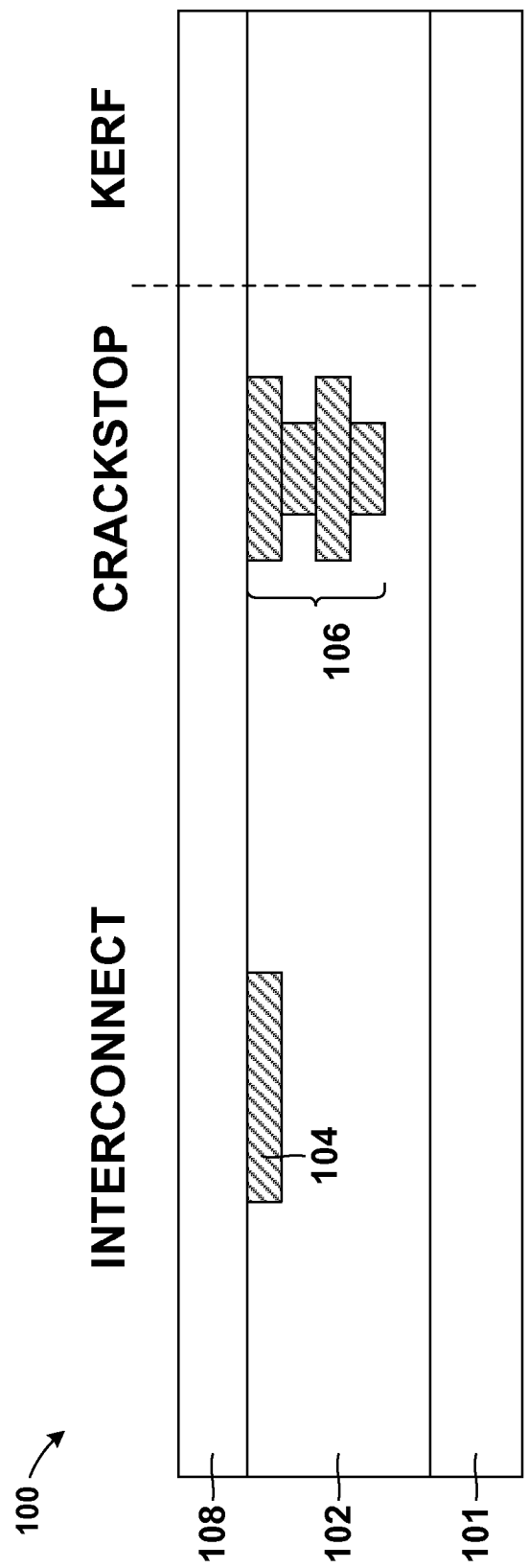
FIG. 1 illustrates a first dielectric layer formed above a substrate according to an exemplary embodiment.

Referring now to FIG. 1, the structure 100 according to an embodiment of the invention is shown. The structure 100 may include a substrate 101 and a back-end-of-line interconnect level 102 (hereinafter "BEOL level"). The substrate 101 may be a bulk semiconductor including, for example, Si, SiGe, SiC, SiGeC, GaAs, InP, InAs and other III-V compound semiconductors, III V compound semiconductors, or layered semiconductors such as, for example, silicon-on-insulators (SOI), SiC-on-insulator (SiCOI) or silicon germanium on insulators (SGOI). For purposes of description, the substrate 101 includes a Si containing semiconductor material such as a single crystal Si. The Substrate 101 may be doped or undoped. Also, the substrate 101 may be strained, unstrained or a combination thereof.

The BEOL level 102 may include a plurality of dielectric layers (not shown) as well as one or more conductive pads 104 and a plurality of metal features 106 embedded as metallization in one or more of the plurality of dielectric layers. The dielectric layers may include any type of dielectric material used for insulating a semiconductor device known to a person of ordinary skill in the art including, for example, a silicon dioxide substrate, a fluorinated silicon dioxide substrate, a silicon glass substrate.

The conductive pad 104 and the metallic structure 106 may include any type of conductive material known to a person of ordinary skill in the art including, for example, copper, aluminum, or tungsten. In an embodiment of the invention, the metallic structure 106 may include multiple metal structures and may form the base of a crackstop feature. In an embodiment of the invention, the metallic structure 106 may have a height greater than a height of the conductive pad 104. For example, the metallic structure 106 may have a height greater than 50% of a thickness of the BEOL level 102. The conductive pad 104 and the metallic structure 106 may be formed within the BEOL level 102 using any forming process known to a person of ordinary skill in the art including, for example, a damascene process. An upper surface of the conductive pad 104 and an upper surface of the metallic structure 106 may be substantially flush with an upper surface of the BEOL level 102.

A first dielectric layer 108 may be formed above the BEOL level 102 and cover both the conductive pad 104 and the metallic structure 106. The first dielectric layer 108 may include any dielectric insulating material including, for example, an oxide, a nitride, or any combination thereof. The first dielectric 108 may be deposited on the BEOL level 102 using any technique known to a person of ordinary skill in the art including, for example, a chemical vapor deposition process.

It should be noted that the first dielectric layer 108, while only depicted as a single layer, may include a plurality of layers. Typically, in a multilayer dielectric structure at this level, the first dielectric layer 108 may consist of a thin copper capping layer of nitride or similar composition and have a thickness ranging from about 10 nm to about 100 nm. The first dielectric layer 108 in this case may include one or more layers of oxide and/or nitride dielectric with any/each of these layers having a thickness ranging from about 0.5 µm to 1.0 µm. The multiple layers of the first dielectric layer 108 may typically have a thickness ranging from about 1.0 µm to about 1.5 µm.

Figure 2:
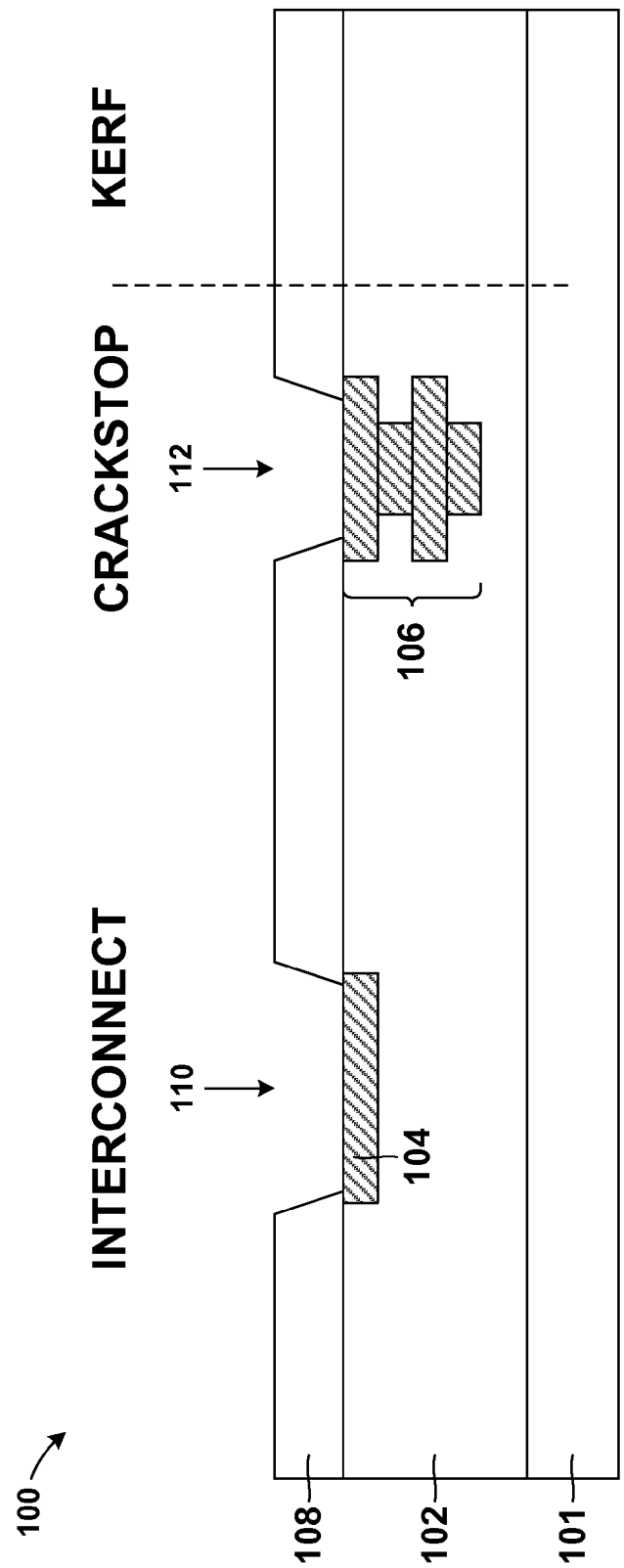
FIG. 2 illustrates patterning the first dielectric layer according to an exemplary embodiment.

Referring now to FIG. 2, a first opening 110 and a second opening 112 may be formed in the first dielectric layer 108. The first opening 110 may be aligned with the conductive pad 104 and the second opening 112 may be aligned with the metallic structure 106. More specifically, the first and second openings 110, 112 may expose the conductive pad 104 and the metallic structure 106, respectively. In the case of the conductive pad 104, the opening 110 may be formed in preparation for an electrical connection. The first and second openings 110, 112 may be formed using any technique known to a person of ordinary skill in the art including, for example, creating a pattern using a standard photoresist process to create the pattern by photolithography and transferring the pattern to the first dielectric layer 108 by a reactive ion etch (RIE) technique using a standard fluorine-containing RIE chemistry. Portions of the first dielectric layer 108 are stripped away, to create the first and second openings 110, 112, using standard techniques known to a person of ordinary skill in the art. The first and second openings 110, 112 may alternatively be referred to as via openings.

Figure 3:
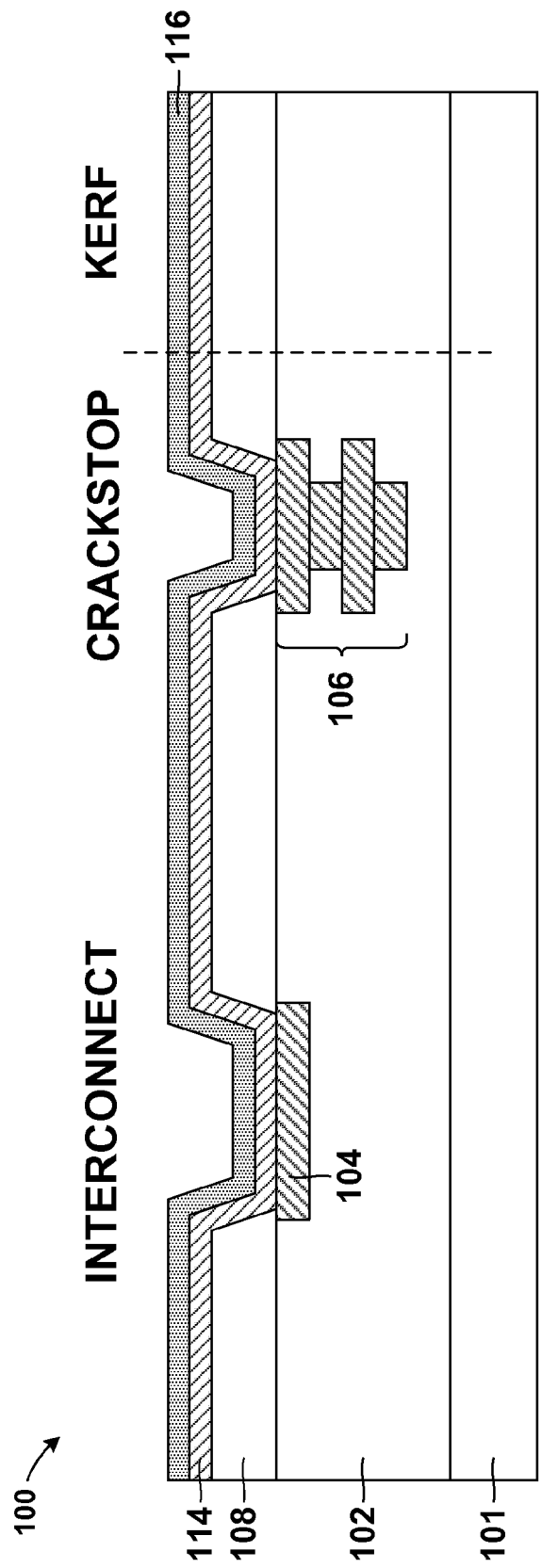
FIG. 3 illustrates forming a metallic liner and a second dielectric layer according to an exemplary embodiment.

Referring now to FIG. 3, a metallic liner 114 may be deposited above the first dielectric layer 108. In doing so, the metallic liner 114 may be deposited within the first and second openings 110, 112 and on top of the conductive pad 104 and on top of the metallic structure 106. As illustrated, the metallic liner 114 is electrically connected to both the conductive pad 104 and the metallic structure 106. The metallic liner 114 may include any metallic conductive material including, for example, tantalum, tantalum nitride, titanium, tungsten, chromium, copper, or any combination thereof. It should be noted that the metallic liner 114, while only depicted as a single layer, may include a plurality of layers, as described below with reference to FIG. 4.

In an embodiment of the invention, the metallic liner 114 may have a thickness ranging from about 50 nm to about 1000 nm. The metallic liner 114 may be deposited over the first dielectric layer 108 using any deposition technique known to a person of ordinary skill in the art including, for example, a physical vapor deposition technique.

A second dielectric layer 116 may be formed above the metallic liner 114. The second dielectric layer 116 may include any dielectric insulating material including, for example, an oxide, a nitride, or any combination thereof. The second dielectric 116 may be deposited on the metallic liner 114 using any technique known to a person of ordinary skill in the art including, for example, a chemical vapor deposition process. It should be noted that the second dielectric layer 116, while only depicted as a single layer, may include a plurality of layers. The second dielectric layer 116 may have a thickness ranging from about 100 nm to about 1000 nm. In an embodiment of the invention, the second dielectric layer 116 may be made of a nitride and have a thickness of about 500 nm.

Figure 4:
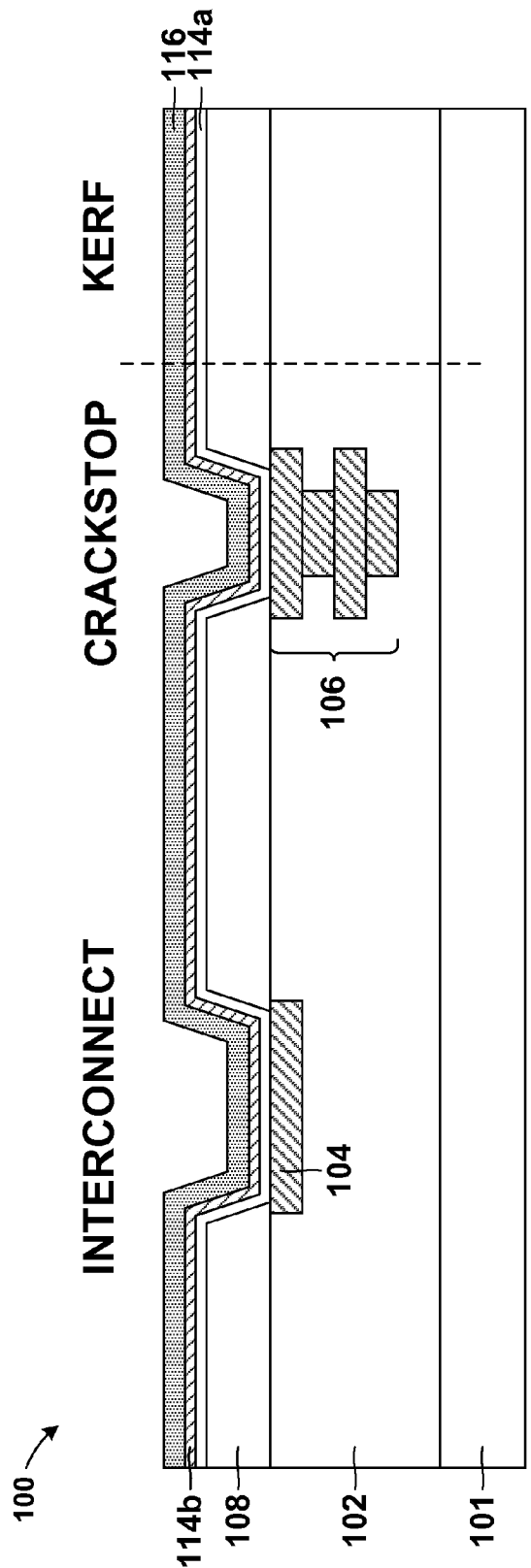
FIG. 4 illustrates multiple layers of the metallic liner according to an exemplary embodiment.

Referring now to FIG. 4, the metallic layer 114 is illustrated as two layers; a barrier layer 114a and a seed layer 114b, according to an embodiment of the invention. In the present embodiment, the barrier layer 114a may be first deposited above the first dielectric layer 108. The seed layer 114b may then be deposited above the barrier layer 114a. The barrier layer 114a may include any metallic conductive material including, for example, tantalum, tantalum nitride, titanium, tungsten, or any combination thereof. The barrier layer 114a may have a thickness ranging from about 10 nm to about 100 nm. The barrier layer 114a may be deposited over the first dielectric layer 108 using any deposition technique known to a person of ordinary skill in the art including, for example, a physical vapor deposition technique. In an embodiment of the invention, the barrier layer 114a may include a layer of tantalum and a layer of tantalum nitride having a total thickness ranging from about 25 nm to about 75 nm. In an embodiment of the invention, the barrier layer 114a may include a layer of titanium tungsten having a total thickness ranging from about 10 nm to about 200 nm. The barrier layer 114a may prevent the diffusion of copper into the first dielectric layer 108.

In the present embodiment, the seed layer 114b may be deposited above the barrier layer 114a. The seed layer 114b may include any metallic conductive material including, for example, copper. The seed layer 114b may have a thickness ranging from about 0.25 µm to about 3 µm. The seed layer 114b may be deposited above the barrier layer 114a using any deposition technique known to a person of ordinary skill in the art including, for example, a physical vapor deposition technique or a plating technique. It should be noted that although the seed layer 114b is illustrated in FIG. 4 as a single layer, it may, in some embodiments, include a plurality of layers.

Figure 5:
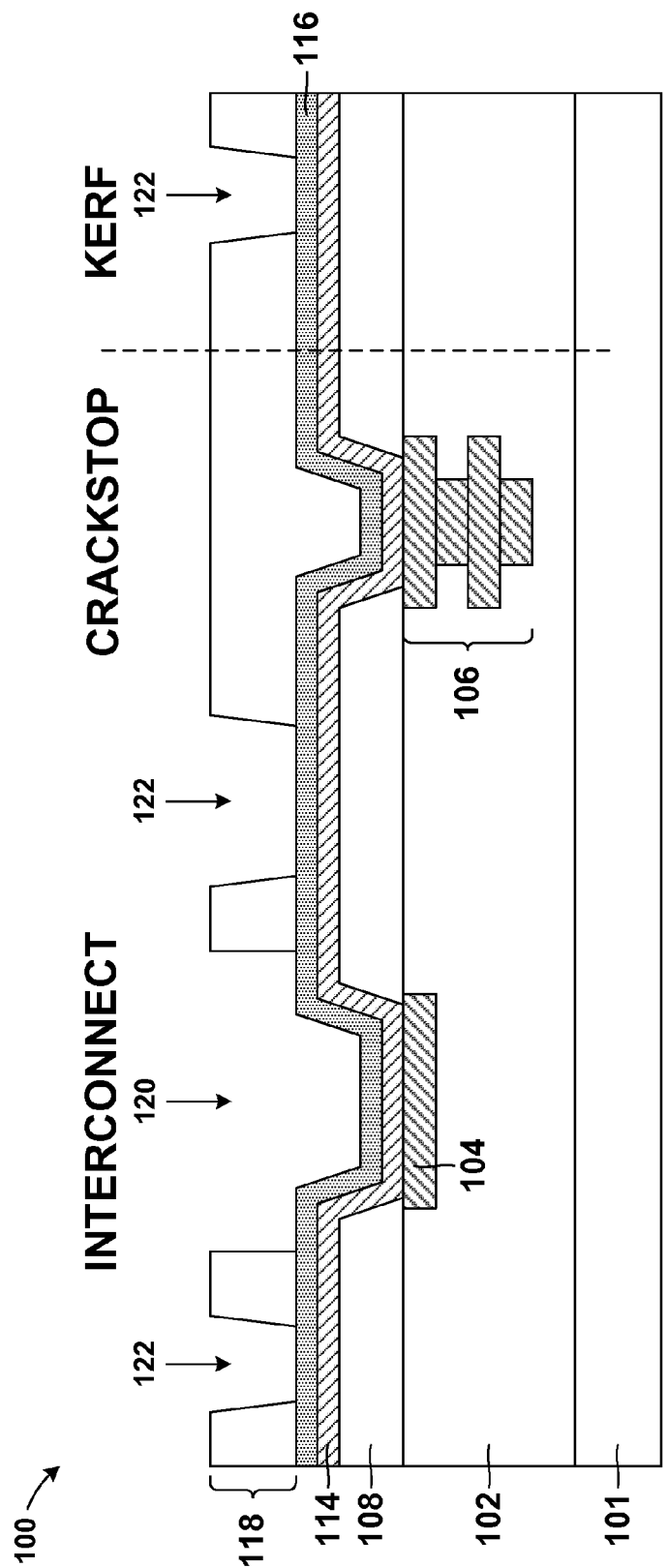
FIG. 5 illustrates patterning a dielectric layer formed above the second dielectric layer according to an exemplary embodiment.

Referring now to FIG. 5, a third dielectric layer 118 may be deposited above the structure 100 and then subsequently patterned to create an opening 120 and one or more field openings 122. It should be noted that while a single opening 120 and three field openings 122 are illustrated in the figure, the third dielectric layer 118 may be patterned to include any number and combination of openings and field openings. The third dielectric layer 118 may include any dielectric material including, for example, a polyimide dielectric material (including a photo sensitive polyimide dielectric material) or an organic dielectric material. The third dielectric layer 118 may be deposited using any process known to a person of ordinary skill in the art including, for example, a standard spin-apply process. In an embodiment of the invention, the third dielectric layer 118 may have a thickness greater than about 1 μm. In an embodiment of the invention, the third dielectric layer 118 may have a thickness ranging from about 500 nm to about 10 μm.

After being deposited, the third dielectric layer 118 may be patterned using any photolithographic process known to a person of ordinary skill in the art. In the present case, the opening 120 may be aligned with the conductive pad 104. It should be noted that the metallic structure 106 in the crackstop region may remain completely covered by the dielectric layer 118.

Figure 6:
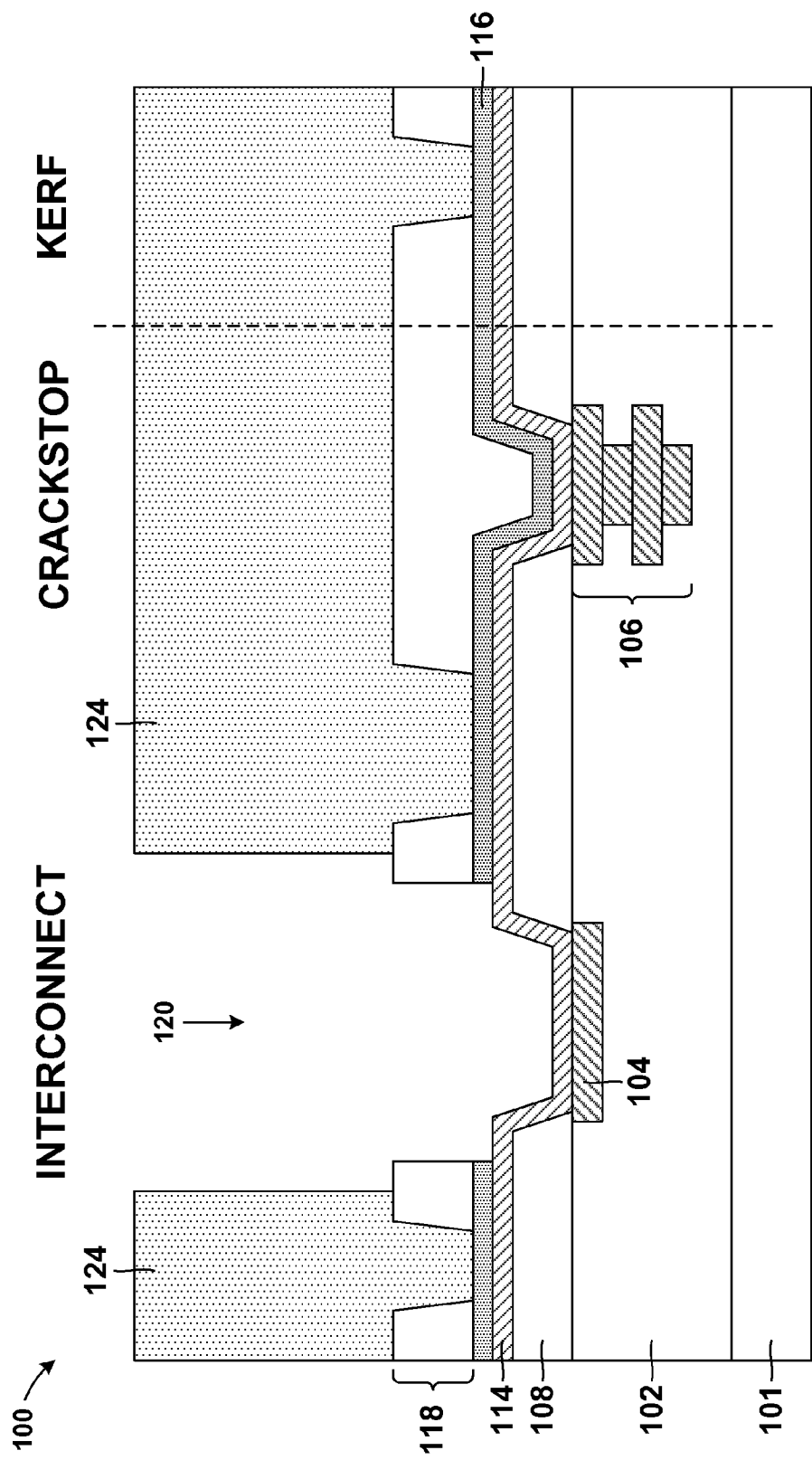
FIG. 6 illustrates removing a portion of the second dielectric layer above a conductive pad according to an exemplary embodiment.

Referring now to FIG. 6, a portion of the second dielectric layer 116 located above the conductive pad 104 may be selectively removed. The portion of the second dielectric layer 116 located above the conductive pad 104 may be removed using any technique known to a person of ordinary skill in the art including, for example, depositing a mask 124, patterning the mask 124, and then etching the second dielectric layer 116 to expose the metallic liner 114. For example, a reactive ion etch (RIE) technique using a standard fluorine-containing RIE chemistry may be used to etch the second dielectric layer 116. In the present step, the portion of the second dielectric layer 116 may be removed selective to both the third dielectric layer 118 and the metallic liner 114. The mask 124 would generally cover and protect any portion of the structure 100 outside of the interconnect region of the structure.

Figure 7:
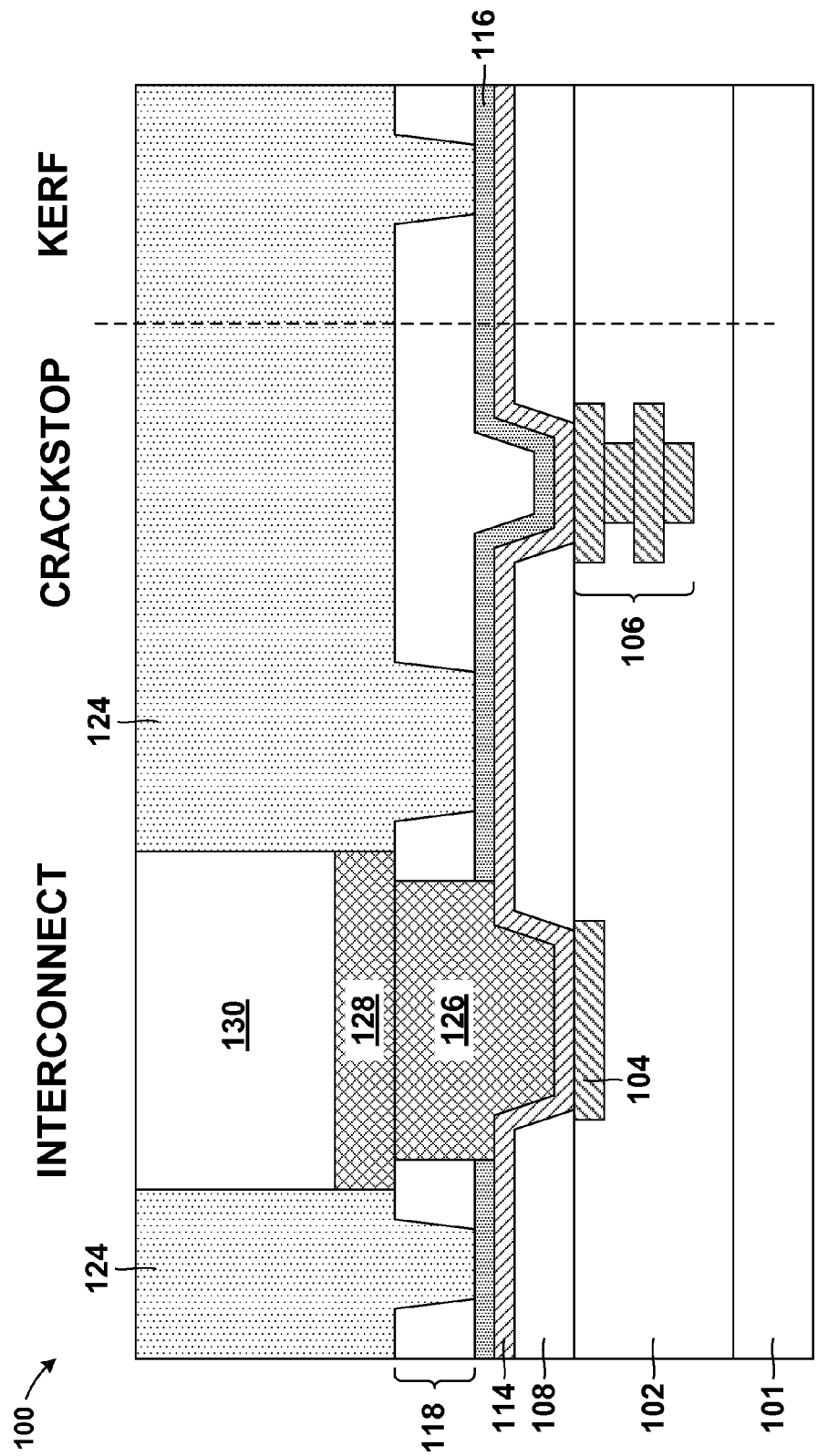
FIG. 7 illustrates forming a copper plug, a copper pedestal, and a solder bump according to an exemplary embodiment.

Referring now to FIG. 7, a copper plug 126 and a copper pedestal 128 may be formed within the opening 120 above the conductive pad 104. More specifically, the copper plug 126 may be formed on the metallic liner 114 within the opening 120, and the copper pedestal 128 may be formed on the copper plug 126. In an embodiment of the invention, the copper plug 126 may be formed using any technique known to a person of ordinary skill in the art including, for example, electroplating. In an embodiment of the invention, the seed layer 114b of the metallic liner 114 may be used to electroplate the copper plug 126. In an embodiment of the invention, the copper pedestal 128 may be formed using any technique known to a person of ordinary skill in the art including, for example, electroplating or physical vapor deposition. Lastly, a solder bump 130 may be formed on the copper pedestal 128 according to any technique known to a person or ordinary skill in the art. In an embodiment of the invention, the solder bump 130 may include any lead free solder including, for example, tin, silver, or any combination thereof.

Figure 8:
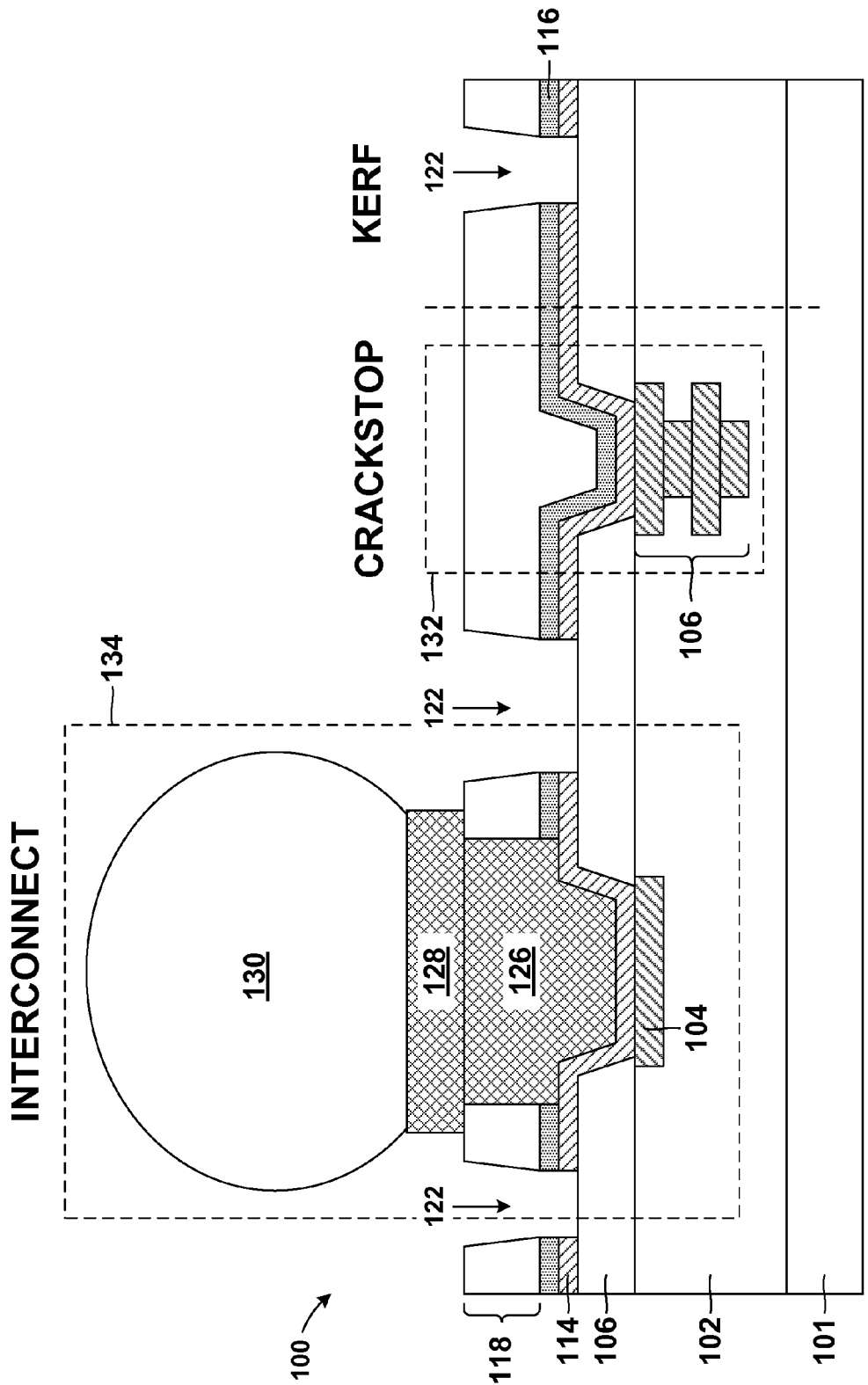
FIG. 8 illustrates removing a portion of the second dielectric layer and a portion of the metallic liner according to an exemplary embodiment.

Referring now to FIG. 8, the mask 124 is first removed. Next, portions of the second dielectric layer 116 may be removed from within the field openings 122. The portions of the second dielectric layer 116 within the field openings 122 may be removed in a similar manner as is described above with reference to FIG. 6. Like above, the portions of the second dielectric layer 116 may be removed selective to both the third dielectric layer 118 and the metallic liner 114.

Next, portions of the metallic liner 114 may be removed from within the field openings 122. The portions of the metallic liner 114 within the field openings 122 may be removed using any technique known to a person of ordinary skill in the art including, for example, a reactive ion etch (RIE) technique using a standard fluorine-containing RIE chemistry. In the present step, the third dielectric layer 118 may function as a mask, and the metallic liner 114 may be removed selective to the dielectric layer 118, the first dielectric layer 108, and the second dielectric layer 116. It should be noted that the metallic liner 114 may remain in the interconnect region.

Lastly, the solder bump 130 may be caused to reflow by heating the structure to a temperature greater than the reflow temperature of the chosen solder. In such cases, the solder bump may typically form a generally spherical shape, as illustrated.

With continued reference to FIG. 8, a final structure 100 is shown. The final structure 100 may include a crackstop structure 132 integrated with a thick dielectric layer (118). An effective crackstop structure may conform to the following reliability guidelines: (a) at every fabrication level have a blocking segment of metal that lies in the path of any microcrack that might originate from chip edge and migrate towards a functional area, for example the interconnect region; (b) does not have any dielectric material that is horizontally continuous through the lateral dimension of the crackstop that may act as a propagation medium for a microcrack that propagates inward from the chip edge; and (c) does not have any exposed copper or other material that may have the potential to corrode or decompose with time after chip manufacturing is complete.

The crackstop structure 132 includes a continuous metal barrier preventing the propagation of a microcrack emanating from the kerf region towards the interconnect region. More specifically, the metallic structure 106 and the metallic liner 114 prevent microcracks in either the BEOL level 102 or the first dielectric layer 108 from propagating from the kerf region into the interconnect region. The final structure 100 may further include a bonding pad structure 134 or solder ball structure which may be formed simultaneously with the crackstop structure 132 using the same process flow. It should be noted that the metallic liner 114 of the crackstop feature 132 is located above the first dielectric layer 108 and below the second dielectric layer 116.

Another embodiment by which to integrate a crackstop structure into a bonding pad structure process flow is described in detail below by referring to the accompanying drawings FIGS. 9 13. In the present embodiment, a capping layer may be formed above a copper pedestal above the conductive pad 104 and a copper pedestal above the metallic structure 106.

FIGS. 9-13 illustrate and describe stages in a fabrication process of a structure 200 in accordance with embodiments of the present invention. Like above, each of the figures is a cross section view of a portion of a semiconductor wafer. Like the structure 100, the structure 200, as illustrated, may be divided into three regions, an interconnect region, a crackstop region, and a kerf region. It should be noted that the following stages of fabrication of the present embodiment described below may be preceded by the fabrication stages described above with reference to FIG. 14. As such, the following description may continue after the description of FIG. 4.

Figure 9:
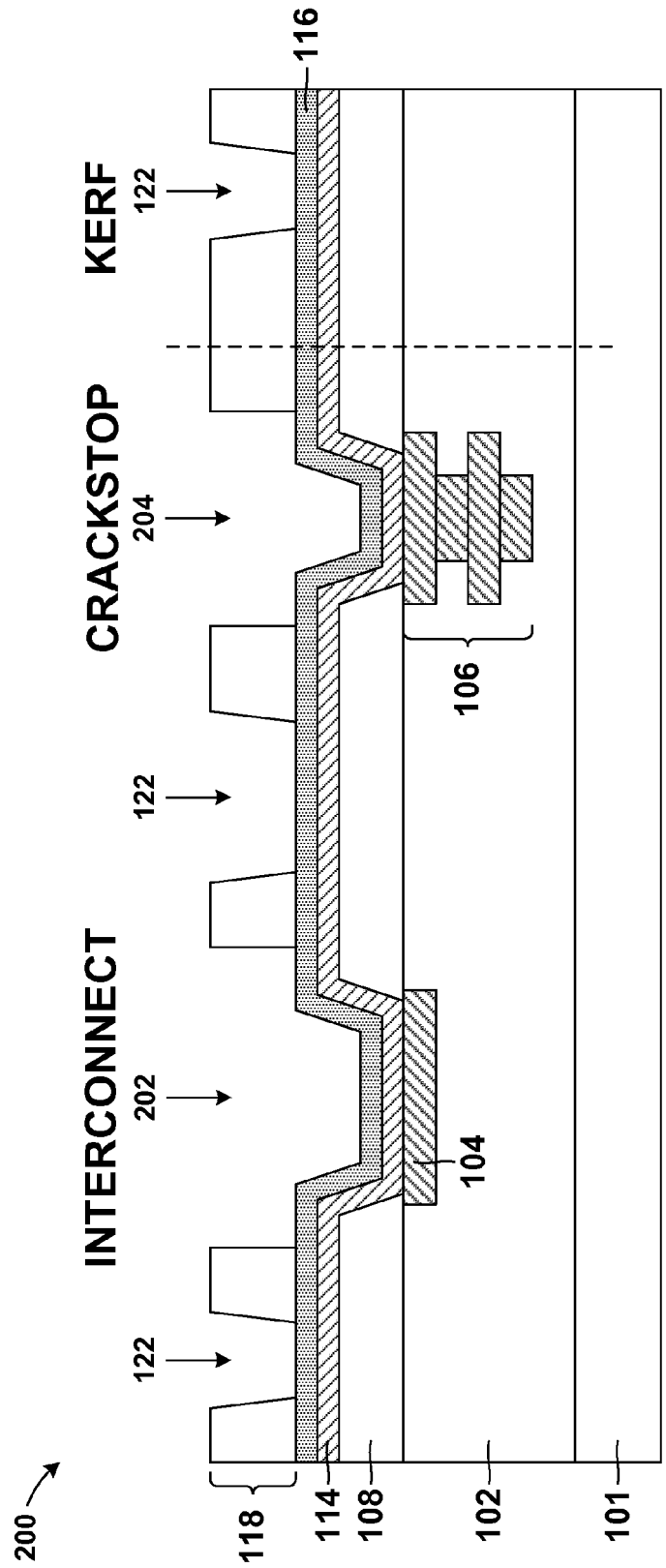
FIG. 9 illustrates patterning a dielectric layer formed above the second dielectric layer according to an exemplary embodiment.

Referring now to FIG. 9, the third dielectric layer 118 may be deposited above the structure 200 and then subsequently patterned to create a first opening 202, a second opening 204, and the field openings 122. Like above, it should be noted that while only two openings (202, 204) and three field openings 122 are illustrated in the figure, the third dielectric layer 118 may be patterned to include any number and combination of openings and field openings. In the present case, the first opening 202 may be aligned with the conductive pad, and the second opening 204 may be aligned with or above the metallic structure 106.

Figure 10:
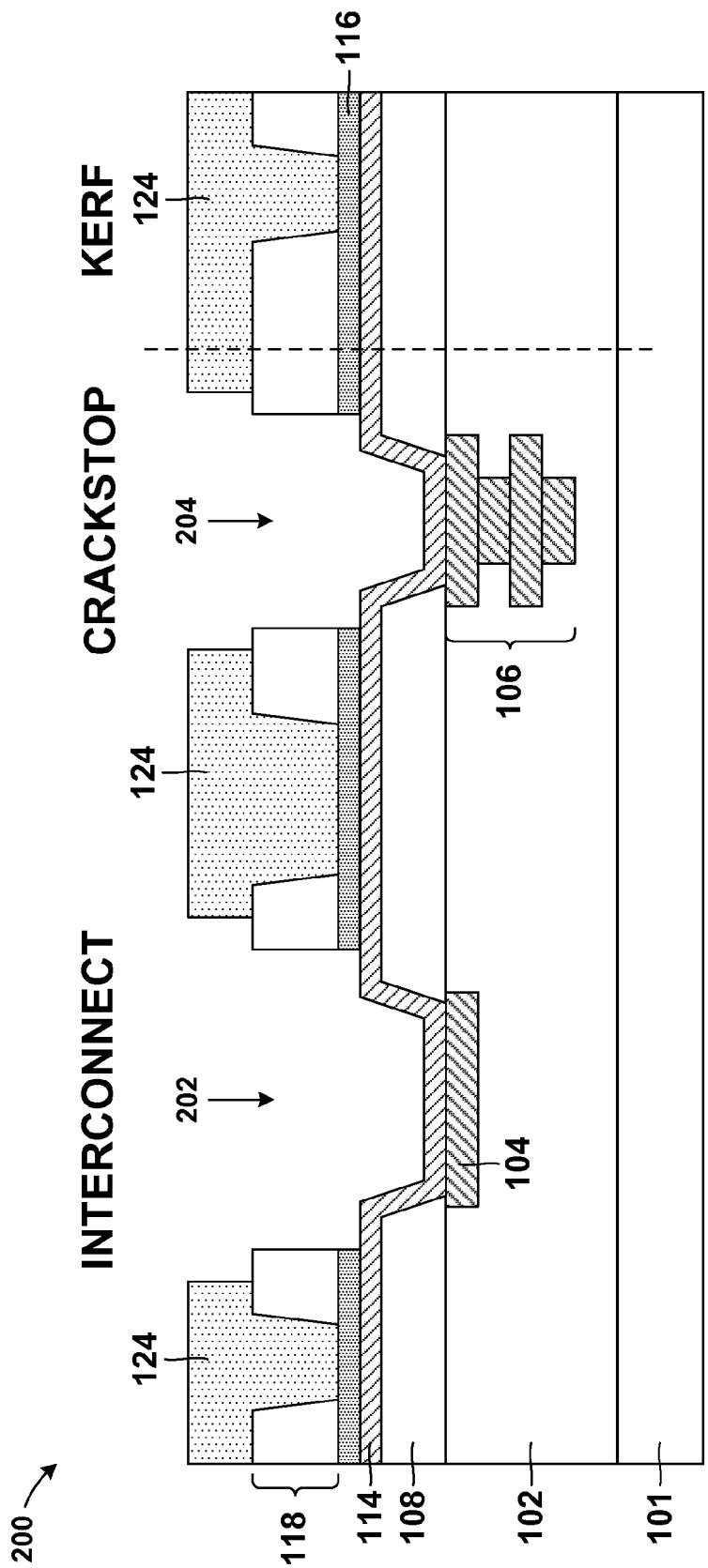
FIG. 10 illustrates removing a portion of the second dielectric layer above a conductive pad and above the metallic structure according to an exemplary embodiment.

Referring now to FIG. 10, a first portion of the second dielectric layer 116 located above the conductive pad 104 and a second portion of the second dielectric layer 116 located above the metallic structure 106 may be selectively removed.

The first and second portions of the second dielectric layer 116 may be removed as described above with reference to FIG. 6.

Figure 11:
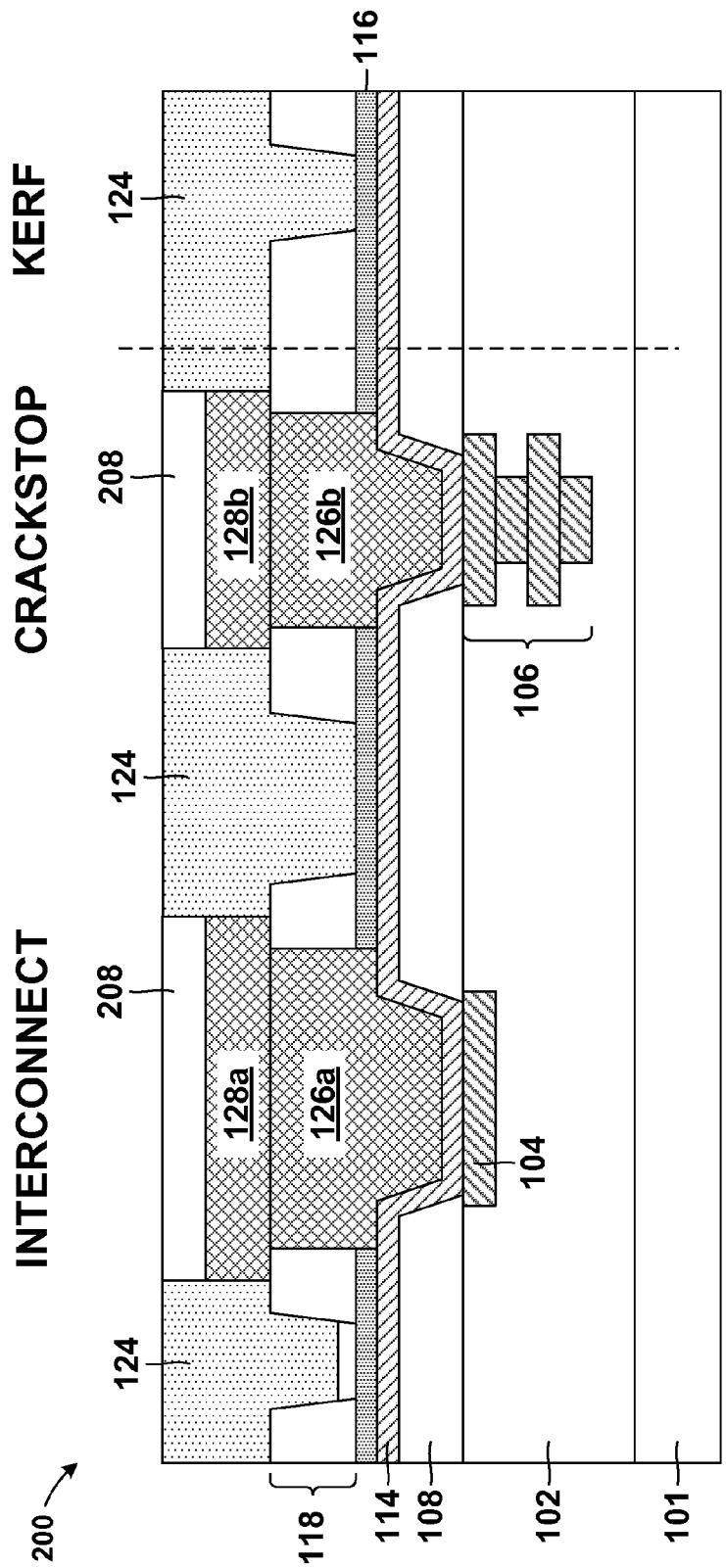
FIG. 11 illustrates forming a first copper plug, a second copper plug, a first copper pedestal, a second copper pedestal, and a capping layer according to an exemplary embodiment.

Referring now to FIG. 11, a first copper plug 126a, and a first copper pedestal 128a may be formed within the first opening 202 above the conductive pad 104, and a second copper plug 126b and a second copper pedestal 128b may be formed within the second opening 206 above the metallic structure 106. More specifically, the first and second copper plugs 126a, 126b may be formed on the metallic liner 114 within the first and second openings 202, respectively. The first and second copper pedestals 128a, 128b may be formed on the copper plugs 126a, 126b, respectively.

A capping layer 208 may be formed on the first and second copper pedestals 128a, 128b in both the interconnect region and the crackstop region. The capping layer, while illustrated as a single layer, may include multiple layers. In an embodiment of the invention the capping layer 208 may include any metallic conductive material including, for example, nickel, copper, or any combination thereof. In an embodiment of the invention, a nickel layer followed by a copper layer may be deposited on the copper pedestal 128. The capping layer 208 may have a thickness ranging from about 100 nm to about 2 µm.

Figure 12:
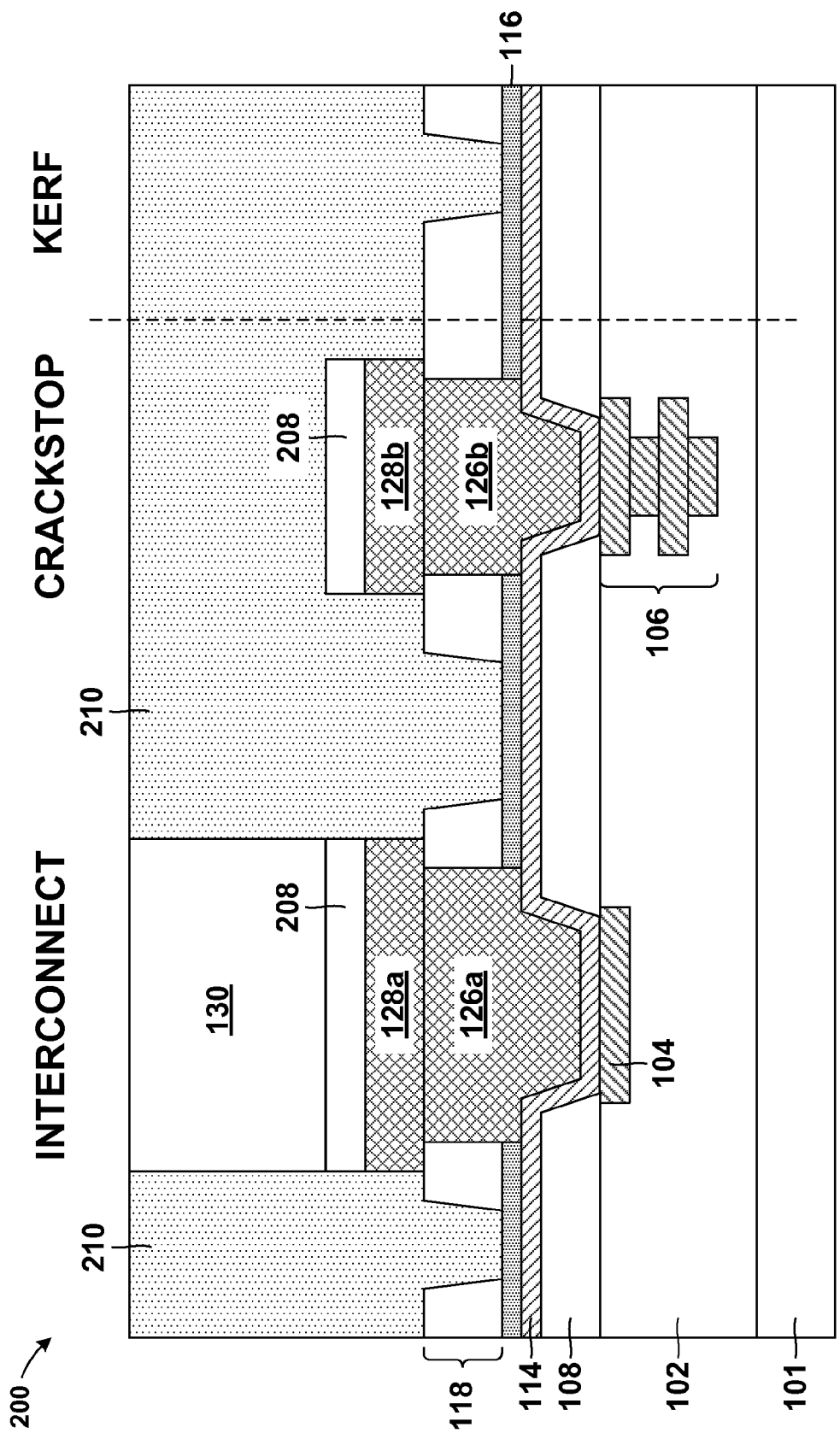
FIG. 12 illustrates forming the solder bump according to an exemplary embodiment.

Referring now to FIG. 12, a second mask 210 may be applied and the solder bump 130 may be formed on the capping layer 208 above the conductive pad 104 in the interconnect region.

Figure 13:
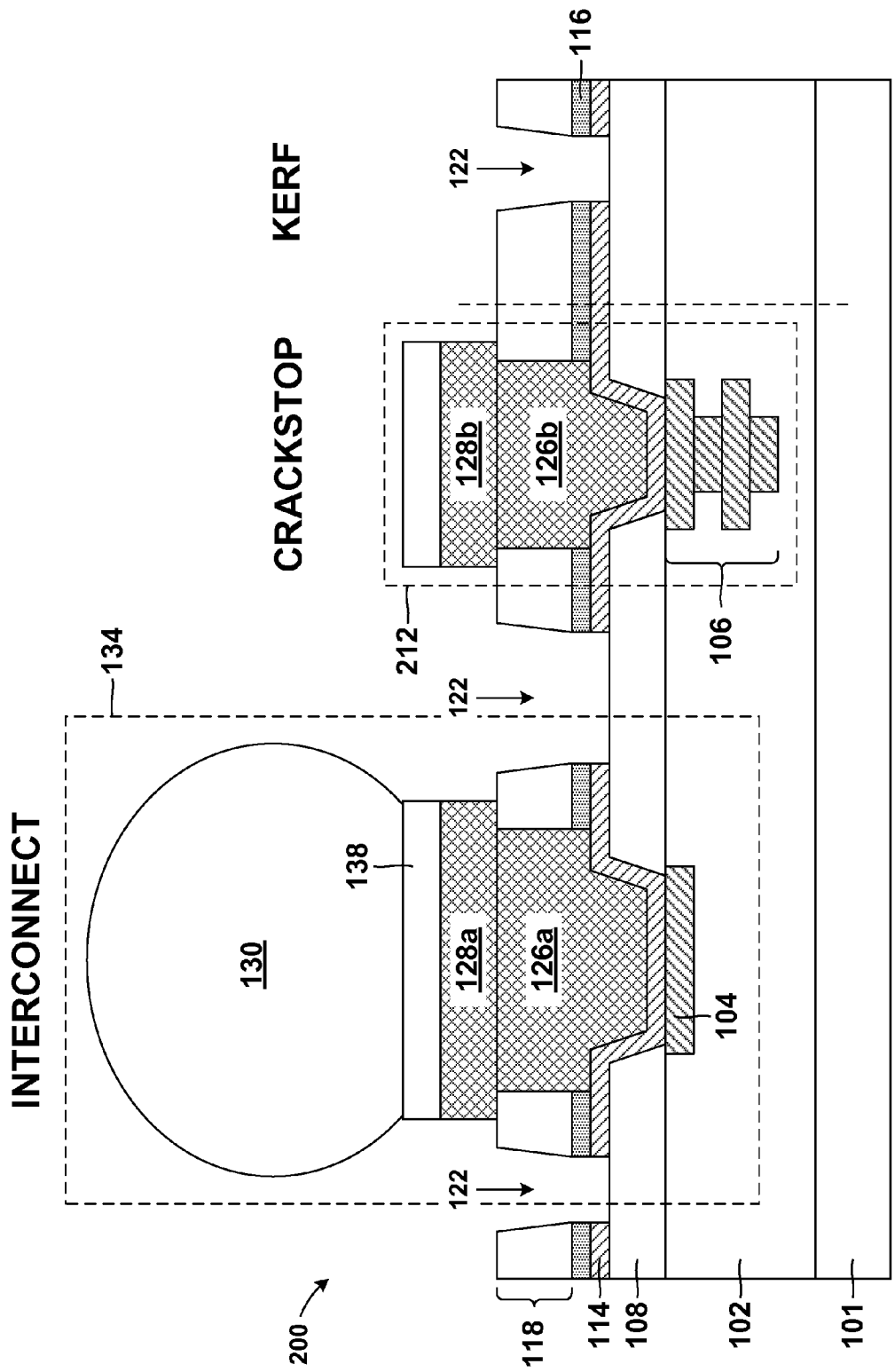
FIG. 13 illustrates removing a portion of the second dielectric layer and a portion of the metallic liner according to an exemplary embodiment.

Referring now to FIG. 13, the second mask 210 is first removed. Like above, portions of the second dielectric layer 116 and portions of the metallic liner 114 may be removed from within the field openings 122. Lastly, like above, the solder bump 130 may be caused to reflow by heating the structure to a temperature greater than the reflow temperature of the chosen solder.

With continued reference to FIG. 13, a final structure 200 is shown. The final structure 200 may include a crackstop structure 212 integrated with a thick dielectric layer (118). Like the crackstop structure 132 above, the crackstop structure 212 includes a continuous metal barrier preventing the propagation of a microcrack emanating from the kerf region towards the interconnect region. More specifically, the metallic structure 106, the metallic liner 114, the second copper plug 126b, and the second copper pedestal may prevent microcracks in either the BEOL level 102, the first dielectric layer 108, or the third dielectric layer 118 from propagating from the kerf region into the interconnect region.

Also like above, the final structure 200 may further include the bonding pad structure 134 which may be formed simultaneously with the crackstop structure 212 using the same process flow. It should be noted that the metallic liner 114 of the crackstop feature 132 is located above the first dielectric layer 108 and below the second dielectric layer 116.

Therefore, the methods and corresponding structures described above enable the simultaneous elimination of the industry standard aluminum pad with the use of a thick PSPI and copper plug final via, for example the third dielectric layer 118 and the copper plug 126. Furthermore, the methods and corresponding structures described above simultaneously provide a reliable chip-edge crackstop structure, for example the crackstop structure 132, that meets crackstop reliability guidelines.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A structure comprising:
   a metallic structure positioned within an interconnect level above a substrate, the metallic structure being adjacent to a kerf of the substrate;
   a first dielectric layer above the interconnect level, the first dielectric layer comprising an opening aligned with and above the metallic structure;
   a metallic liner above the first dielectric layer, within the opening, and on the metallic structure;
   a second dielectric layer above the metallic liner;
   a third dielectric layer above the second dielectric layer, the third dielectric layer being thicker than either the first dielectric layer or the second dielectric layer;
   a conductive pad within the interconnect level, the first dielectric layer further comprising a second opening aligned with and above the conductive pad and the metallic liner further being within the second opening and on the conductive pad;
   a copper plug on the metallic liner above the conductive pad;
   a copper pedestal on the copper plug; and
   a solder structure on the copper pedestal.

2. The structure of claim 1, the third dielectric layer comprising a polyimide dielectric material, a photo sensitive polyimide dielectric material, or an organic dielectric material.

3. The structure of claim 1, the first dielectric layer comprising an oxide and the second dielectric layer comprising a nitride.

4. The structure of claim 1, the metallic liner comprising tantalum, tantalum-nitride, titanium, tungsten chromium, copper, or any combination thereof.

5. The structure of claim 1, further comprising:
   a second copper plug on the metallic liner above the metallic structure;
   a second copper pedestal on the second copper plug; and
   a capping layer on the second copper pedestal.

6. A structure comprising:
   an interconnect level above a substrate and comprising a conductive pad and a metallic structure positioned laterally adjacent to the conductive pad, the metallic structure being a base of a crackstop feature and having a greater height than the conductive pad;
   a first dielectric layer on the interconnect level with a first opening extending vertically through the first dielectric layer to the metallic structure and a second opening extending vertically through the first dielectric layer to the conductive pad and;
   a metallic liner on the first dielectric layer lining the first opening so as to be adjacent to the metallic structure and lining the second opening so as to be adjacent to the conductive pad;
   a second dielectric layer above the metallic liner; and,
   a third dielectric layer above the second dielectric layer with a third opening aligned above the conductive pad and extending vertically through the third dielectric layer and the second dielectric layer to the metallic liner and with a fourth opening located between the conductive pad and the metallic structure and extending vertically through the third dielectric layer, the second dielectric layer and the metallic liner and stopping at a top surface of the first dielectric layer such that a portion of the third dielectric layer remains above the metallic structure, the third dielectric layer being thicker than the first dielectric layer and thicker than the second dielectric layer, and the third dielectric layer and second dielectric layer having stacked portions aligned above the metallic structure.

7. The structure of claim 6, the third dielectric layer comprising a polyimide dielectric material, a photo sensitive polyimide dielectric material, or an organic dielectric material.

8. The structure of claim 6, the first dielectric layer comprising an oxide.

9. The structure of claim 6, the second dielectric layer comprising a nitride.

10. The structure of claim 6, the metallic liner comprising tantalum, tantalum-nitride, titanium, tungsten chromium, copper, or any combination thereof.

11. The structure of claim 6, further comprising:
   a copper plug on the metallic liner in the second opening and the third opening aligned above the conductive pad such that an upper portion of the copper plug is laterally surrounded by the third dielectric layer.

12. The structure of claim 11, further comprising:
   a copper pedestal on the copper plug and extending laterally onto a top surface of the third dielectric layer; and
   a solder structure on the copper pedestal.

13. A structure comprising:
   an interconnect level above a substrate and comprising a conductive pad and a metallic structure positioned laterally adjacent to the conductive pad;
   a first dielectric layer on the interconnect level with a first opening extending vertically through the first dielectric layer to the metallic structure and a second opening extending vertically through the first dielectric layer to the conductive pad and;
   a metallic liner on the first dielectric layer lining the first opening so as to be adjacent to the metallic structure and lining the second opening so as to be adjacent to the conductive pad;
   a second dielectric layer above the metallic liner;
   a third dielectric layer above the second dielectric layer with a third opening aligned above the conductive pad and extending vertically through the third dielectric layer and the second dielectric layer to the metallic liner, with a fourth opening located between the conductive pad and the metallic structure and extending vertically through the third dielectric layer, the second dielectric layer and the metallic liner to the first dielectric layer, and with a fifth opening aligned above the metallic structure and extending vertically through the third dielectric layer and the second dielectric layer to the metallic liner,
   the third dielectric layer being thicker than the first dielectric layer and thicker than the second dielectric layer;
   a copper plug on the metallic liner in the second opening and the third opening aligned above the conductive pad such that an upper portion of the copper plug is laterally surrounded by the third dielectric layer;
   a copper pedestal on the copper plug and extending laterally onto a top surface of the third dielectric layer; and
   a solder structure on the copper pedestal.

14. The structure of claim 13, the third dielectric layer comprising a polyimide dielectric material, a photo sensitive polyimide dielectric material, or an organic dielectric material.

15. The structure of claim 13, the first dielectric layer comprising an oxide.

16. The structure of claim 13, the second dielectric layer comprising a nitride.

17. The structure of claim 13, the metallic liner comprising tantalum, tantalum-nitride, titanium, tungsten chromium, copper, or any combination thereof.

18. The structure of claim 13, further comprising:
   a second copper plug on the metallic liner in the first opening and the fifth opening aligned above the metallic structure such that an upper portion of the second copper plug is laterally surrounded by the third dielectric layer;
   a second copper pedestal on the second copper plug and extending laterally onto the top surface of the third dielectric layer; and
   a capping layer on the second copper pedestal.

* * * * *